(12) United States Patent
Chang et al.

(10) Patent No.: US 7,985,006 B2
(45) Date of Patent: Jul. 26, 2011

(54) LIGHT SOURCE DEVICE

(75) Inventors: Chung-Min Chang, HsinChu (TW); Tse-An Lee, HsinChu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 320 days.

(21) Appl. No.: 12/332,307

(22) Filed: Dec. 10, 2008

(65) Prior Publication Data

US 2009/0303713 A1   Dec. 10, 2009

(30) Foreign Application Priority Data

Jun. 10, 2008   (CN) .......................... 2008 1 0302087

(51) Int. Cl.
*F21V 29/00* (2006.01)
(52) U.S. Cl. .................... 362/294; 362/249.02; 257/100
(58) Field of Classification Search ............. 362/249.01, 362/245, 294, 373, 249.02; 257/100; 361/719
See application file for complete search history.

(56) References Cited

U.S. PATENT DOCUMENTS

| | | | | |
|---|---|---|---|---|
| 5,249,104 A | * | 9/1993 | Mizobe | ........................ 362/605 |
| 6,362,964 B1 | * | 3/2002 | Dubhashi et al. | ............. 361/707 |
| 7,388,750 B2 | * | 6/2008 | Kim | ............................... 361/704 |
| 7,815,341 B2 | * | 10/2010 | Steedly et al. | ................ 362/294 |
| 2005/0237739 A1 | * | 10/2005 | Lee et al. | ....................... 362/241 |
| 2007/0139895 A1 | * | 6/2007 | Reis et al. | ..................... 361/719 |
| 2008/0074862 A1 | * | 3/2008 | Chang | ............................. 362/29 |
| 2008/0080181 A1 | * | 4/2008 | Yu et al. | ........................ 362/249 |
| 2008/0112165 A1 | * | 5/2008 | Mori et al. | .................... 362/241 |

FOREIGN PATENT DOCUMENTS

| | | |
|---|---|---|
| CN | 1753200 A | 3/2006 |
| CN | 1934721 A | 3/2007 |
| CN | 201004458 Y | 1/2008 |
| EP | 1139019 A1 | 10/2001 |
| TW | 200810589 A | 2/2007 |
| TW | 200744228 A | 12/2007 |
| TW | M332791 Y | 5/2008 |

* cited by examiner

*Primary Examiner* — Jong-Suk (James) Lee
*Assistant Examiner* — Peggy A. Neils
(74) *Attorney, Agent, or Firm* — Clifford O. Chi (57) ABSTRACT

A light source device includes a circuit member, a heat dissipation component, an optical component and light emitting diode assemblies. The circuit member defines spaced through holes. The light emitting diode assemblies have a first side and a second side opposite to the first side. Each light emitting diode assembly passes through a corresponding through hole and is electrically connected to the circuit member. The heat dissipation component contacts the first side, is spaced from the circuit member, and is configured to dissipate heat generated by the light emitting diode assemblies. The optical component contacts the second side, and is configured to distribute light emitted from the light emitting diode assemblies.

17 Claims, 7 Drawing Sheets

LIGHT SOURCE DEVICE

BACKGROUND

1. Technical Field

The disclosure relates to a light source device.

2. Description of Related Art

Light emitting diodes (LEDs) are widely used as a light source for illumination due to their excellent characteristics, for example, a small volume, good optical properties, low energy consumption, and a long lifespan.

A typical light source device includes a container, a cover, and LED assemblies. The LED assemblies are received in the container and covered by the cover. Each LED assembly includes a printed circuit board (PCB) and LEDs secured on the PCB. However, the container, the cover, and the PCB all have low heat conductivities, such that heat generated by the LED assemblies cannot be immediately dissipated.

Therefore, a new light source device is desired to overcome the above-described shortcoming.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION OF THE EMBODIMENTS

Figure 1:
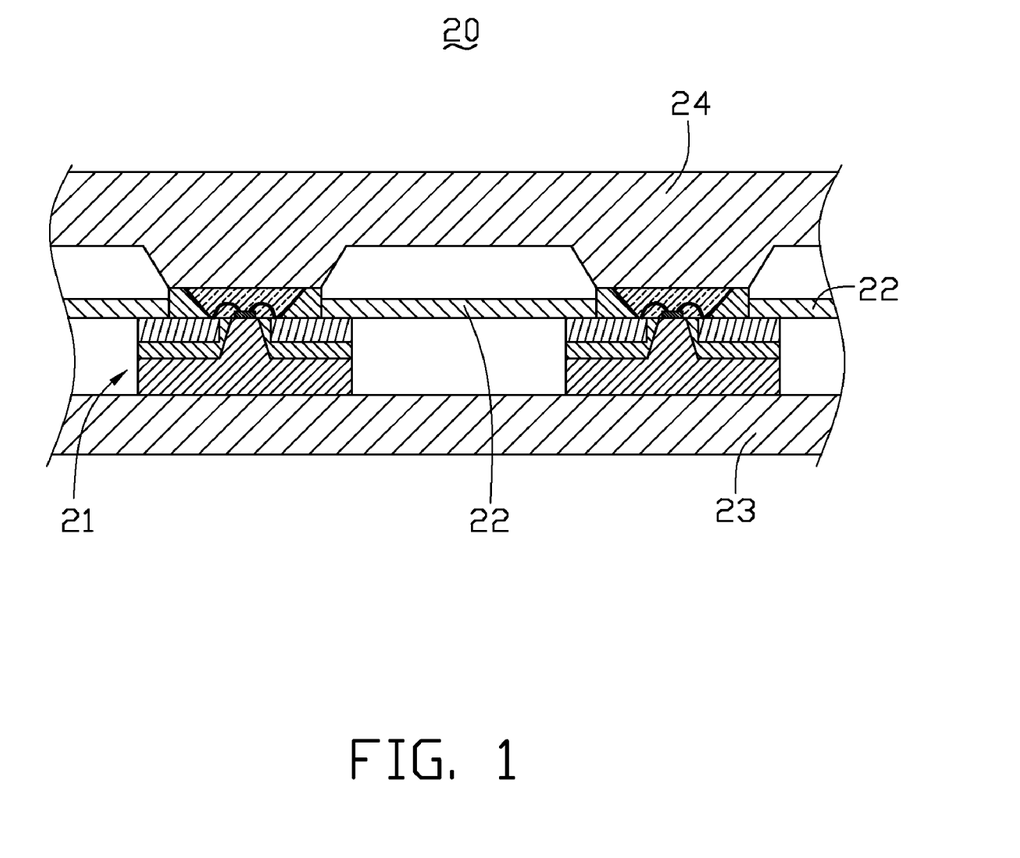
FIG. 1 is a cross-sectional view of a first embodiment of a light source device.
Figure 2:
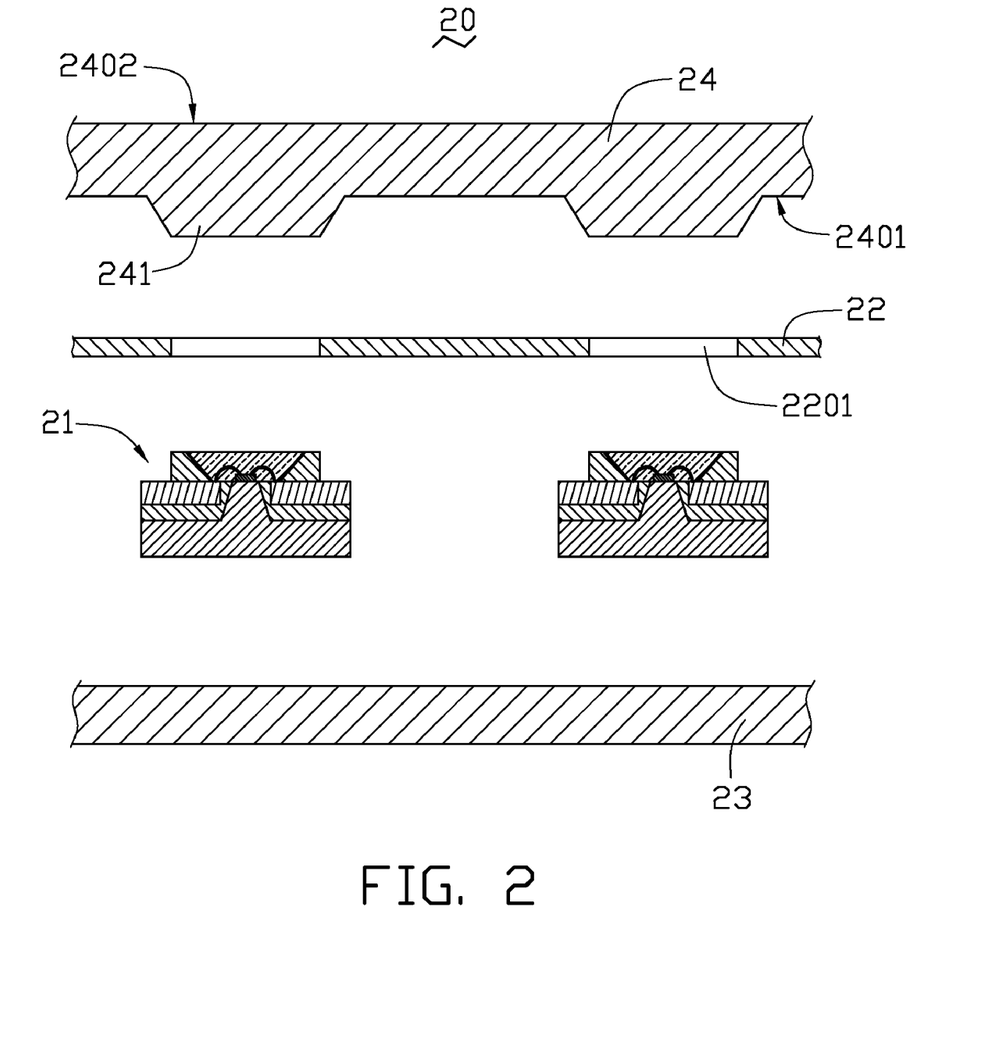
FIG. 2 is an exploded view of the light source device of FIG. 1.

Referring to FIGS. 1 and 2, a first embodiment of a light source device 20 includes a plurality of LED assemblies 21, a circuit member 22, a heat dissipation component 23, and an optical component 24. Each LED assembly 21 passes through the circuit member 22 and is positioned between the heat dissipation component 23 and the optical component 24. The circuit member 22 is electrically connected to the LED assemblies 21. The heat dissipation component 23 is spaced from the optical component 24.

The circuit member 22 may be a lead frame or a circuit board, such as a Flame Retardant 4 (FR4) printed circuit board (PCB), a bismaleimide-triazine resin PCB, or a metal-core PCB. The circuit member 22 may be a one-piece structure. A plurality of through holes 2201 is defined in the circuit member 22 to receive the LED assemblies 21.

The heat dissipation component 23 conducts heat generated by the LED assemblies 21 and dissipates the heat to outside of the light source device 20. The heat dissipation component 23 may be made of a heat-conducted material such as a metallic material (e.g. copper, aluminum, silver, gold), ceramic material, or organic material (e.g. diamond like carbon, or carbon fiber). The heat dissipation component 23 may be a heat sink, a heat pipe, or a heat spreader.

The optical component 24 evenly distributes light emitted from the LED assemblies 21. The optical component 24 includes a light input surface 2401, a light output surface 2402 opposite to the light input surface 2401, and side surfaces (not labeled) between the light input surface 2401 and the light output surface 2402. A plurality of spaced protrusion portions 241 extends from the light input surface 2401 to contact the LED assemblies 21. Each protrusion portion 241 may be substantially frustoconical shaped. The light output surface 2402 may be a rough surface. The optical component 24 may be a light guide plate, a transparent thin film, or an optical lens. The optical component 24 may be made of a material having high light transmittance, such as polycarbonate, polymethyl methacrylate, or glass. The optical component 24 may be doped with phosphor materials, light diffusion particles, or light reflection particles to evenly distribute the light emitted from the LED assemblies 21. In one embodiment, the light emitted from the LED assemblies 21 can be outputted from the light output surface 2402 and the side surfaces, thereby forming a three-dimensional light source. In another embodiment, the side surfaces are coated with a reflective coating, thereby improving the intensity of light outputted from the light output surface 2402.

Figure 3:
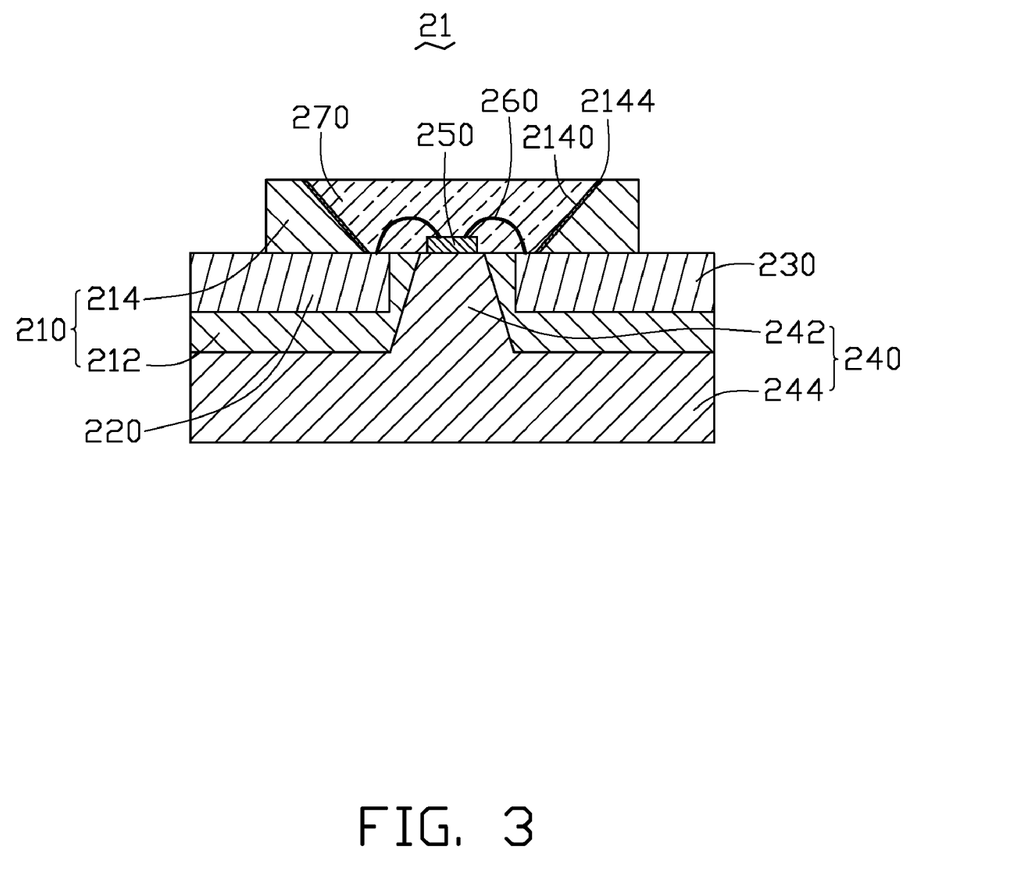
FIG. 3 is a cross-sectional view of a LED assembly of the light source device of FIG. 1.
Figure 4:
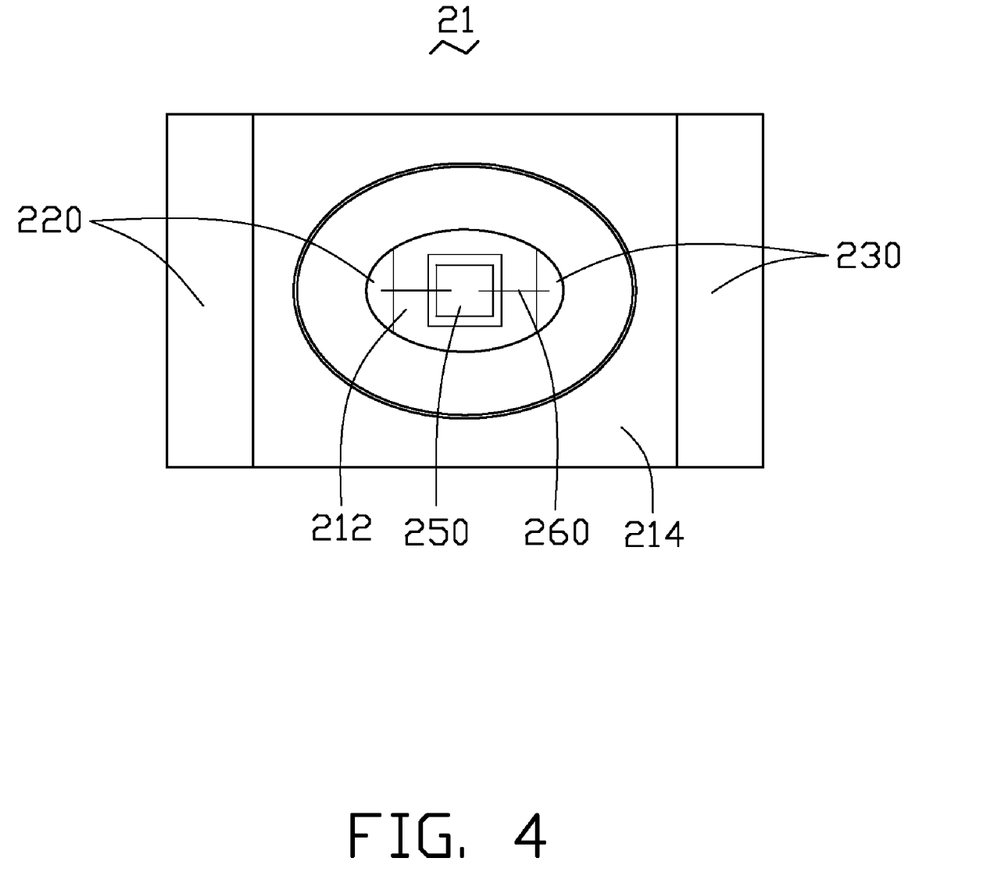
FIG. 4 is a perspective view of the LED assembly of FIG. 3.

Also referring to FIGS. 3 and 4, each LED assembly 21 includes a dielectric member 210, a first electrode 220, a second electrode 230, a heat conduction member 240, an LED chip 250, a packaging member 270, and conductive wires 260.

The dielectric member 210 includes a support portion 212 and a light reflecting portion 214 integrally formed with the support portion 212. A substantially frustoconical groove 2140 is defined in a central portion of the light reflecting portion 214 and extends to the support portion 212, whereby a part of the support portion 212 is exposed to the groove 2140. In one embodiment, a light reflection layer 2144 may be formed on the inner surface of the groove 2140. The dielectric member 210 may be made of a liquid crystal polymer.

The first and second electrodes 220, 230 are symmetrically embedded in opposite sides of the dielectric member 210 and positioned between the support portion 212 and the light reflecting portion 214. Each electrode has an inserted end and a connection end opposite to the inserted end. A portion of inserted end of each electrode is exposed to the groove 2140. The connection end extends out the light reflecting portion 214 to electrically connect to the circuit member 22.

The heat conduction member 240 includes a substrate 244 and a projecting portion 242 extending from the substrate 244 to the groove 2140. The supporting portion 212 is positioned on the substrate 244, encompasses the projecting portion 242, and isolates the heat conduction member 240 from the first and second electrodes 220, 230. A top surface of the projecting portion 242 passes through the support portion 212 and is exposed to the groove 2140. The LED chip 250 is positioned on the top surface of the projecting portion 242. The conductive wires 260 electrically connect the LED chip 250 to the inserted ends of the first and second electrodes 220, 230. The heat conduction member 240 may be made of materials having high heat conductivities, such as copper, aluminum, or gold.

The packaging member 270 fills up the groove 2140, and packages the LED chip 250 and the conductive wires 260. The packaging member 270 may be made of transparent dielectric materials, such as epoxy resin, silicone. In one embodiment, the packaging member 270 may be doped with phosphor materials, light diffusion particles, or light reflection particles to evenly distribute light emitted from the LED assemblies.

Each light reflecting portion 214 is received in a corresponding through hole 2201. The circuit member 22 is positioned on and electrically contacts the connection ends of the first and second electrodes 220, 230. The LED assemblies 21 with the circuit member 22 are positioned on the heat dissipation component 23. The substrate 244 contacts the heat dissipation component 23. In one embodiment, heat-conducted mediums having high heat conductivities, for example tin, may be positioned between the substrate 244 and the heat dissipation component 23. The optical component 34 is positioned on the LED assemblies 21 and adjacent to the circuit member 22. Each protrusion portion 241 contacts the light reflecting portion 214 and the packaging member 270 of a corresponding LED assembly 21.

Each heat conduction member 240 connects a corresponding LED chip 250 to the heat dissipation component 23. Therefore, heat generated by the LED assemblies 21 is immediately conducted to the heat conduction member 240 and dissipated by the heat dissipation component 23.

Figure 5:
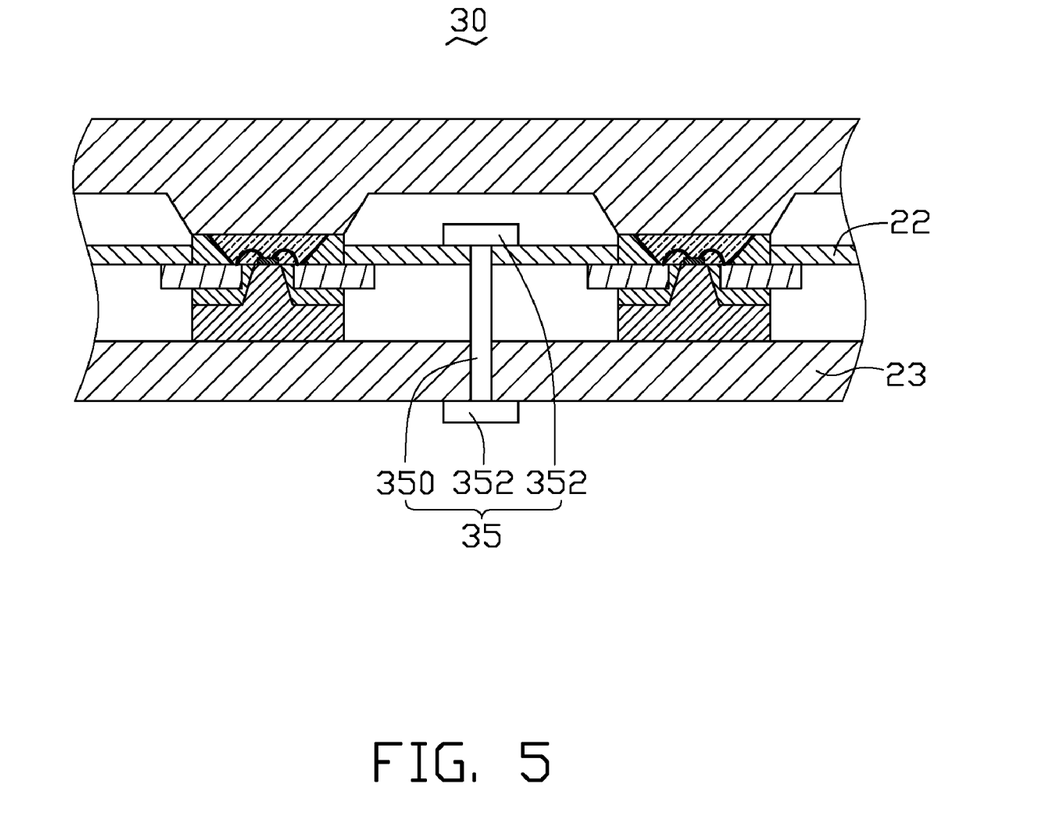
FIG. 5 is a cross-sectional view of a second embodiment of a light source device.

Referring to FIG. 5, a second embodiment of a light source device 30 is similar to the light source device 20 of FIGS. 1 to 4, except that the light source device 30 further includes a fixing component 35. The fixing component 35 includes a connection portion 350 and two clipping portions 352. The connection portion 350 passes through the circuit member 22 and the heat dissipation component 23. The two clipping portions 352 are positioned at two ends of the connection portion 350 and clip the circuit member 22 and the heat dissipation component 23.

Figure 6:
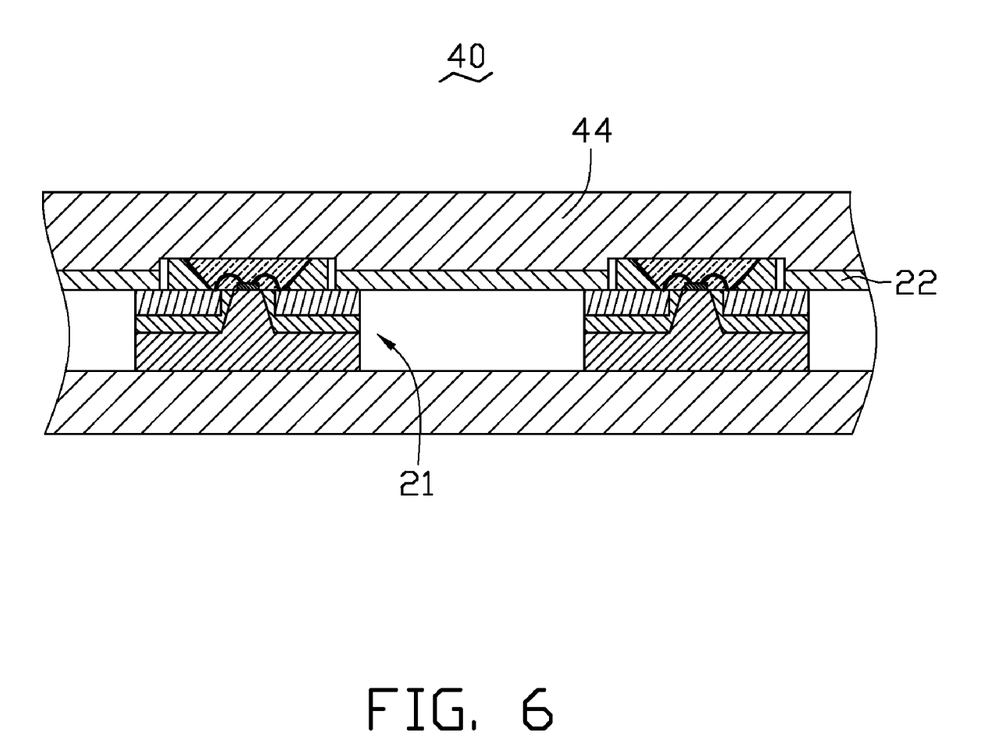
FIG. 6 is a cross-sectional view of a third embodiment of a light source device.
Figure 7:
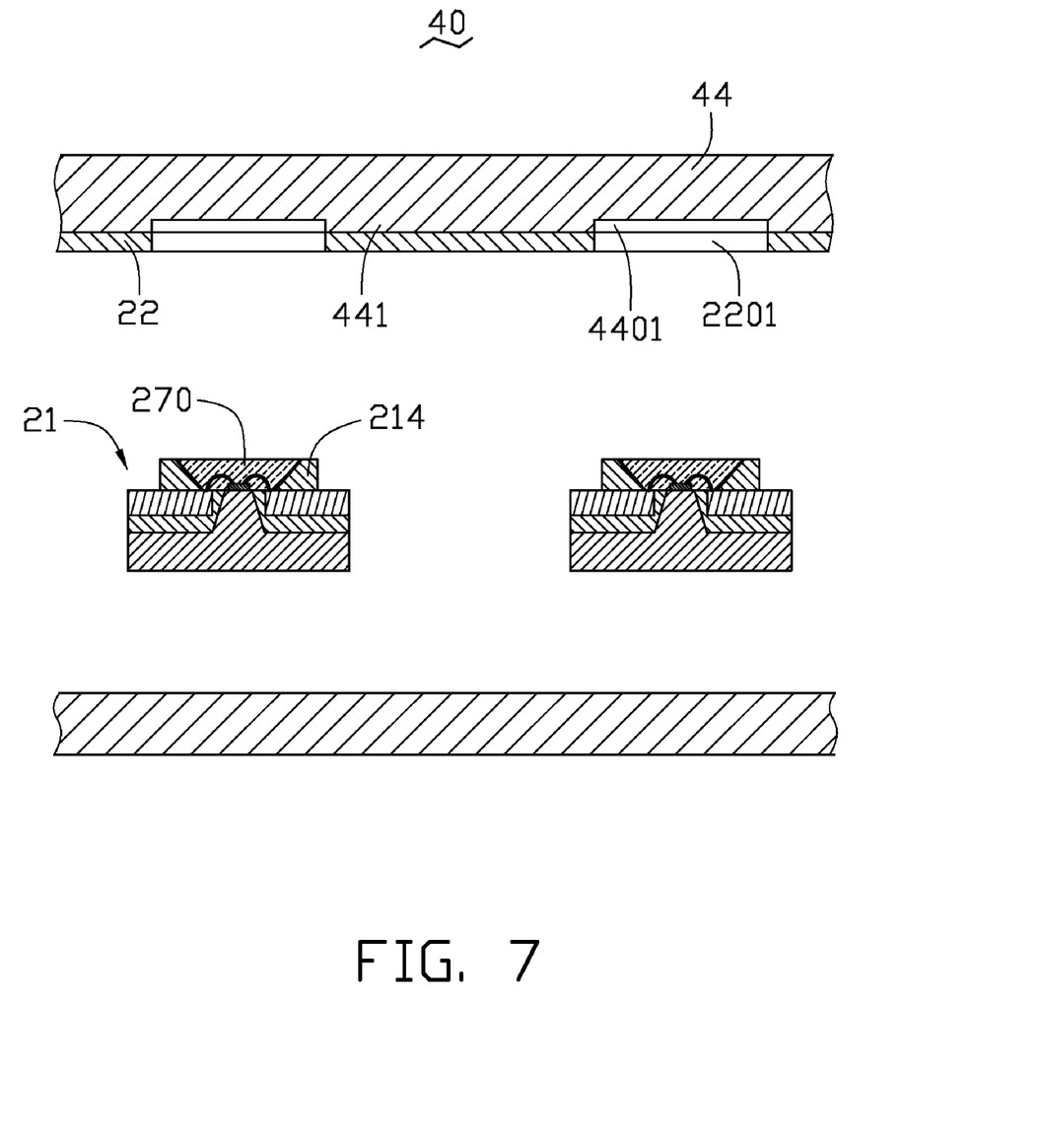
FIG. 7 is an exploded view of the light source device of FIG. 6.

Referring to FIGS. 6 and 7, a third embodiment of a light source device 40 is similar to the light source device 20 of FIGS. 1 to 4, except that the optical component 44 forms a plurality of spaced protrusions 441. Each protrusion 441 may be substantially rectangular shaped. A substantially rectangular recess 4401 is defined between adjacent protrusions 441. Each light reflecting portion 214 and each packaging member 270 pass through a corresponding through hole 2201 and are received in a corresponding recess 4401. The circuit member 22 contacts the plurality of spaced protrusions 441. In one embodiment, the circuit member 22 is a transparent circuit layer and contains indium tin oxide (ITO) material.

It is believed that the present embodiments and their advantages will be understood from the foregoing description, and it will be apparent that various changes may be made thereto without departing from the spirit and scope of the embodiments or sacrificing all of its material advantages, the examples here before described merely being preferred or exemplary embodiments.

What is claimed is:

1. A light source device, comprising:
a circuit member defining a plurality of spaced through holes;
a plurality of light emitting diode assemblies having a first side and a second side opposite to the first side, each light emitting diode assembly passing through a corresponding through hole and electrically connected to the circuit member;
a heat dissipation component contacting the first side, spaced from the circuit member and configured to dissipate heat generated by the plurality of light emitting diode assemblies; and
an optical component contacting the second side and configured to distribute light emitted from the plurality of light emitting diode assemblies;
wherein each light emitting diode assembly comprises a dielectric member, a heat conduction member, and a light emitting diode chip; a groove is defined in each dielectric member; one side of the heat conduction member passes through the dielectric member and is exposed to the groove; another side of the heat conduction member contacts the heat dissipation component; the light emitting diode chip is received in the groove and positioned on the heat conduction member;
wherein the heat conduction member comprises a substrate and a projecting portion extending from the substrate to the groove; the substrate is positioned on the heat dissipation component; the projecting portion supports the light emitting diode chip; and
wherein the dielectric member comprises a support portion and a light reflecting portion; the groove is defined in a central portion of the light reflecting portion; the light reflecting portion is received in a corresponding through hole; the supporting portion is positioned on the substrate and encompasses the projecting portion.

2. The light source device of claim 1, wherein the groove is substantially frustoconical shaped.

3. The light source device of claim 1, wherein a light reflection layer is positioned on an inner surface of the groove.

4. The light source device of claim 1, wherein each light emitting diode assembly further comprises a packaging member positioned in the groove and packaging the light emitting diode chip.

5. The light source device of claim 1, wherein each light emitting diode assembly further comprises a first electrode and a second electrode symmetrically embedded in opposite sides of the dielectric member and positioned between the support portion and the light reflecting portion; each electrode has an inserted end and a connection end opposite to the inserted end; a portion of the inserted end of each electrode is exposed to the groove, and electrically connected to the light emitting diode chip via a conductive wire; the connection end of each electrode extends out the light reflecting portion and is electrically connected to the circuit member; the support portion isolates the first and second electrodes to the heat conduction member.

6. The light source device of claim 1, wherein the optical component comprises a light input surface and a light output surface opposite to the light input surface; a plurality of spaced protrusion portions is positioned on the light input surface; each light reflecting portion contacts a corresponding protrusion portion.

7. The light source device of claim 6, wherein each protrusion portion is substantially frustoconical shaped.

8. The light source device of claim 6, wherein the light output surface is a rough surface.

9. The light source device of claim 1, wherein a plurality of spaced protrusions is positioned on the optical component; a substantially rectangular recess is defined between adjacent protrusions; each light reflecting portion passes through a corresponding through hole and is received in a corresponding recess; the circuit member contacts the plurality of spaced protrusions.

10. The light source device of claim 1, further comprising a fixing component comprising a connection portion and two clipping portions; wherein the connection portion passes through the circuit member and the heat dissipation component; the two clipping portions are positioned at two ends of the connection portion and clip the circuit member and the heat dissipation component.

11. The light source device of claim 1, wherein the circuit member is selected from the group consisting of a flame retardant 4 printed circuit board, a bismaleimide-triazine resin printed circuit board and a metal-core printed circuit board.

12. The light source device of claim 11, wherein the circuit member is a transparent circuit layer.

13. The light source device of claim 12, wherein the transparent circuit layer contains indium tin oxide material.

14. The light source device of claim 1, wherein the heat dissipation component is made of materials selected from the group consisting of copper, aluminum, silver, gold, ceramic, diamond like carbon and carbon fiber.

15. The light source device of claim 1, wherein the heat dissipation component is a heat sink, a heat pipe, or a heat spreader.

16. The light source device of claim 1, wherein the optical component is doped with phosphor materials, light diffusion particles, or light reflection particles.

17. The light source device of claim 1, wherein the optical component is a light guide plate, a transparent thin film, or an optical lens.

* * * * *